United States Patent

Frisch

Patent Number: 5,905,383
Date of Patent: *May 18, 1999

[54] MULTI-CHIP MODULE DEVELOPMENT SUBSTRATE

[75] Inventor: Arnold M. Frisch, Portland, Oreg.

[73] Assignee: Tektronix, Inc., Wilsonville, Oreg.

[*] Notice: This patent issued on a continued prosecution application filed under 37 CFR 1.53(d), and is subject to the twenty year patent term provisions of 35 U.S.C. 154(a)(2).

[21] Appl. No.: 08/521,148

[22] Filed: Aug. 29, 1995

[51] Int. Cl.⁶ .................................................. G01R 31/26
[52] U.S. Cl. ................................................. 324/765
[58] Field of Search ................................... 324/765, 731, 324/519, 679, 755; 438/18; 29/830, 831, 846, 850, 593; 361/700, 748, 782

[56] References Cited

U.S. PATENT DOCUMENTS

| | | | |
|---|---|---|---|
| 4,833,402 | 5/1989 | Boegh-Petersen | 324/754 |
| 5,070,297 | 12/1991 | Kwon et al. | 324/754 |
| 5,103,557 | 4/1992 | Leedy | 29/832 |
| 5,123,850 | 6/1992 | Elder et al. | 439/67 |
| 5,254,942 | 10/1993 | D'Souza et al. | 324/73.1 |
| 5,266,912 | 11/1993 | Kledzik | 333/247 |
| 5,274,270 | 12/1993 | Tuckerman | 257/758 |
| 5,397,997 | 3/1995 | Tuckerman et al. | 324/754 |
| 5,406,210 | 4/1995 | Pedder | 324/757 |
| 5,418,470 | 5/1995 | Dagostino et al. | 324/763 |
| 5,428,626 | 6/1995 | Frisch et al. | 371/27 |
| 5,477,160 | 12/1995 | Love | 324/755 |
| 5,661,409 | 8/1997 | Mohsen | 324/765 |

*Primary Examiner*—Josie Ballato
*Assistant Examiner*—Russell M. Kobert
*Attorney, Agent, or Firm*—Brent F. Logan; Boulden G. Griffith; Thomas F. Lenihan

[57] ABSTRACT

A multi-chip module development substrate (12) contains embedded test circuitry (30). Vias (38) connect I/O channels (Cn) of the test circuitry with conductive runs in interconnect layers (16,18) that are part of an interconnect structure (17) of the development substrate. Integrated circuit chips (14) are then mounted on the multi-chip module development substrate in selected electrical contact with the conductive runs. The embedded test circuitry includes multiple timing analyzer circuits (TAn) and multiple analog probe circuits en). In a preferred embodiment, these timing analyzer circuits and analog probe circuits are provided in redundant pairs, with a pair of each associated with each of the I/O channels. Multiple pairs of each kind of circuit are grouped within test cells (70) physically arranged in rectangular areas. Adjacent test circuit cells may be rotated with respect to each other to achieve more efficient connections to interconnect structure. After verification testing for proper operation of the multi-chip module circuitry, production versions of the multi-chip module are fabricated on multi-chip module production substrates not containing the test circuitry, thereby removing the extra cost and complexity associated with the development substrate.

17 Claims, 5 Drawing Sheets

MULTI-CHIP MODULE DEVELOPMENT SUBSTRATE

FIELD OF THE INVENTION

The present invention relates generally to testing circuitry for evaluation and verification of a device under test and more particularly to a MCM development substrate having embedded test circuitry for testing chips mounted on the substrate to form a multi-chip module.

BACKGROUND OF THE INVENTION

Testing of multi-chip modules (MCM) is made difficult by a number of factors; the density of chips on the modules leaves little space for any test circuitry, the close spacing of leads or pads on chips and the corresponding interconnects on the substrate complicates routing between test points of the MCM and the test circuitry, and the method of mounting and electrically connecting chips on an MCM can make some desired test points virtually inaccessible.

One attempt at solving these problems included placing the testing circuitry on the chip to be tested. Although this can provide access to test points internal to the chip, it also adds overhead to the chip, increasing its size and cost. Furthermore, the testing circuitry adds complexity to the chip which may not be removed when the chip is put into full production.

What is needed is technique for testing high-density multi-chip modules that can access test points hidden under chips and within areas of tightly spaced leads without adding cost or complexity to the modules when they are put into production.

SUMMARY OF THE INVENTION

Accordingly, the present invention provides for test circuitry embedded within a MCM development substrate. Vias connect I/O channels of the test circuitry with conductors on the surface of the substrate. Interconnect layers to support a particular multi-chip module layout may then be built on the development substrate with leads connecting desired test points to the I/O channels of the test circuitry.

The test circuitry can measure and (optionally) provide test signals to the multi-chip module to test for proper operation. Once proper operation is confirmed, production multi-chip modules can be fabricated on standard substrates not containing embedded test circuitry, so that no cost is added to the production version of the multi-chip modules.

These and other features and advantages of the present invention will become apparent upon examination of the following specification when taken in conjunction with the drawings.

DETAILED DESCRIPTION OF THE INVENTION

Figure 1:
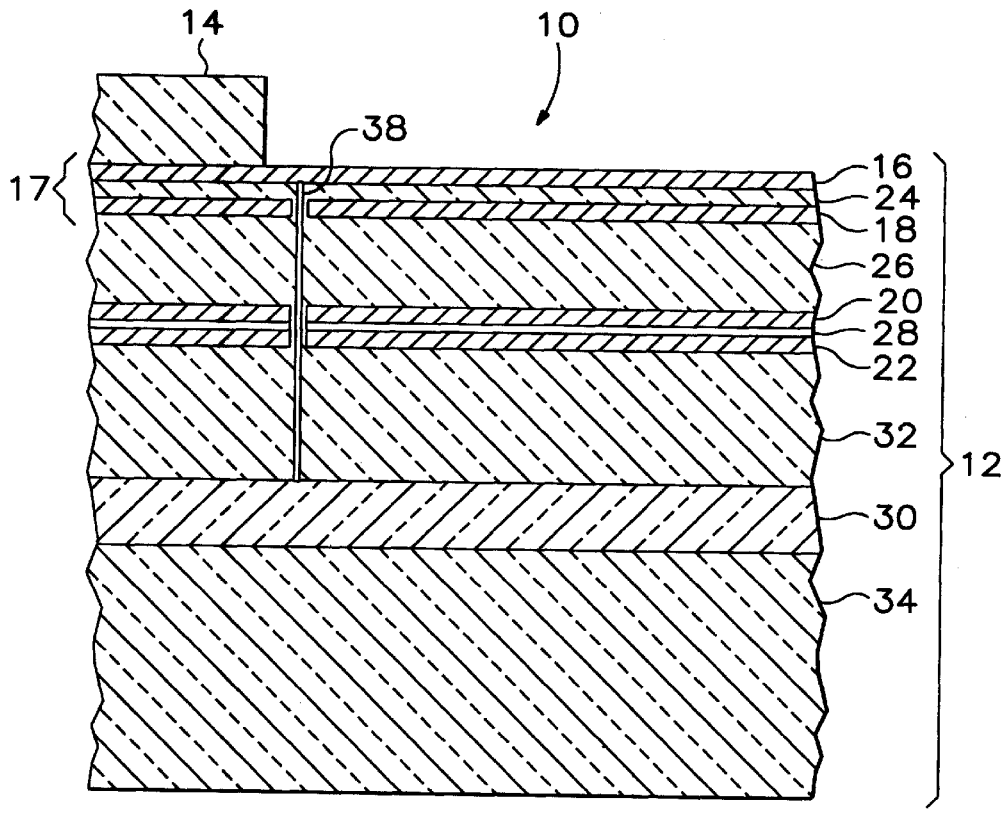
FIG. 1 is a sectional view of a multi-chip module fabricated a MCM development substrate that has test circuitry according to the present invention.

Referring now to FIG. 1, a multi-chip module 10 having a MCM development substrate 12 embodying the present invention includes a plurality of layers, to be further described below, and can accommodate a plurality of integrated circuit chips, such as chip 14 mounded on MCM development substrate 12. The chips are interconnected by leads arranged on two interconnect layers 16 and 18 and receive power and ground connections from power and ground planes 20 and 22, respectively. The conductive leads on the interconnect layers 16 and 18 are electrically insulated from each other by oxide layer 24, and together these layers comprise an interconnect structure 17. In some embodiments, there may be only a single one of the interconnect layers 16 and 18 within the interconnect structure 17, while in others there may be two or more such interconnect layers. Another oxide layer 26 electrically insulates the upper layers 17 from the power plane 20. Anodized layer 28 provides electrical insulation between the power plane 20 and ground plane 22.

A test circuit 30 is embedded within the MCM development substrate 12 below the power and ground planes 20 and 22 and is electrically insulated from them by another oxide layer 32. The test circuit 30 is fabricated on the top of silicon substrate 34, and the other layers described above are then fabricated on top of it. Actually, silicon substrate 34 need not necessarily be silicon, but may alternatively be any suitably inactive substrate, such as one composed of any insulative or dielectric material.

As is discussed in more detail below, test circuit 30 includes a plurality of input/output (I/O) channels Cn. In a preferred embodiment these channels Cn are regularly spaced in rows or columns or an array of both rows and columns. Vias 38 electrically connect channels Cn within the test circuit 30 with conductors in the interconnect layers 16 and 18. Leads on the interconnect layers 16 and 18 are arranged to intersect with these conductors to connect test points of the MCM with selected I/O channels Cn.

Figure 2:
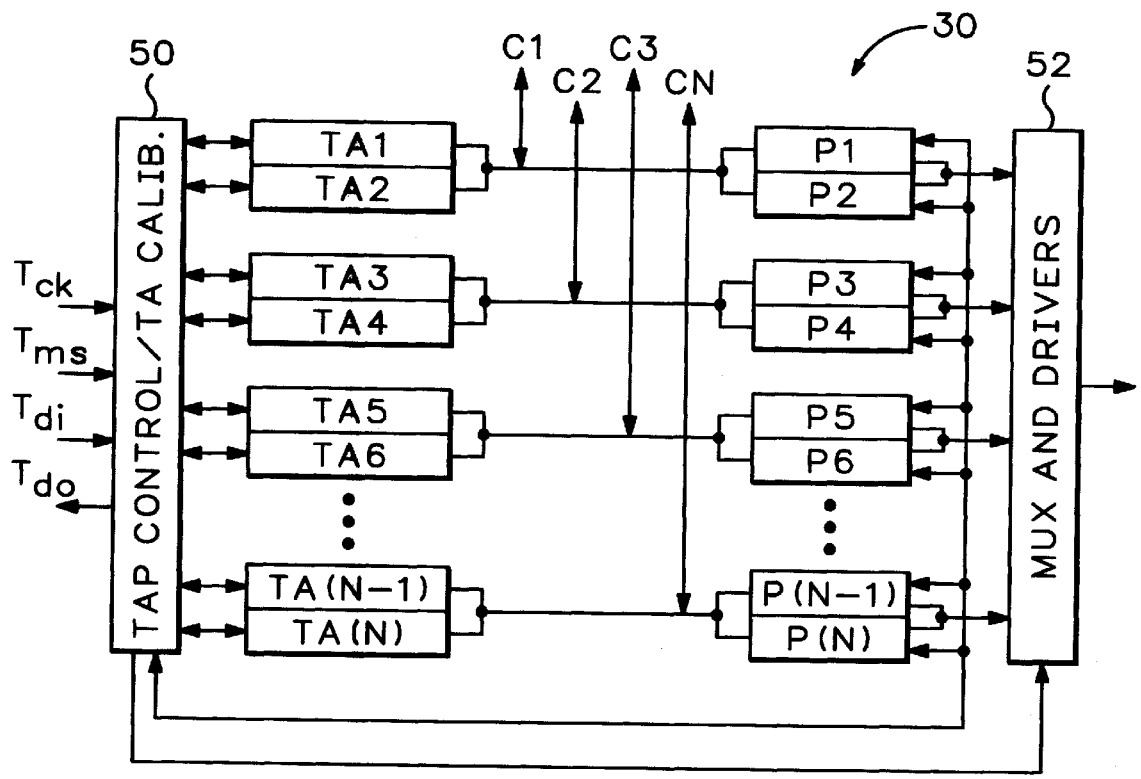
FIG. 2 is a block diagram of the test circuitry of FIG. 1.

Referring now to FIG. 2, test circuit 30 includes a plurality of timing analyzers TAn and analog probes Pn. A standard IEEE 1149.1 boundary scan interface 48, or similar program bus, is provided for programming test circuit 10. A test access port (TAP) controller 50 provides appropriate signals from a test clock TCK and a test master signal TMS.

In a preferred embodiment, the timing analyzers TAn and probes Pn are grouped in pairs to provide redundancy and thereby increase manufacturing yield. Both timing analyzers and both probes in a redundant pair are connected to the same input/output (I/O) channel Cn, but in operation only one is enabled at a time. For example, timing analyzers TA1 and TA2 are paired and connected to input/output channel C1, as are analog probes P1 and P2; then only one of each pair of test circuits needs to operate correctly in order to provide full functionality in measuring the test point connected to I/O channel C1.

Figure 3:
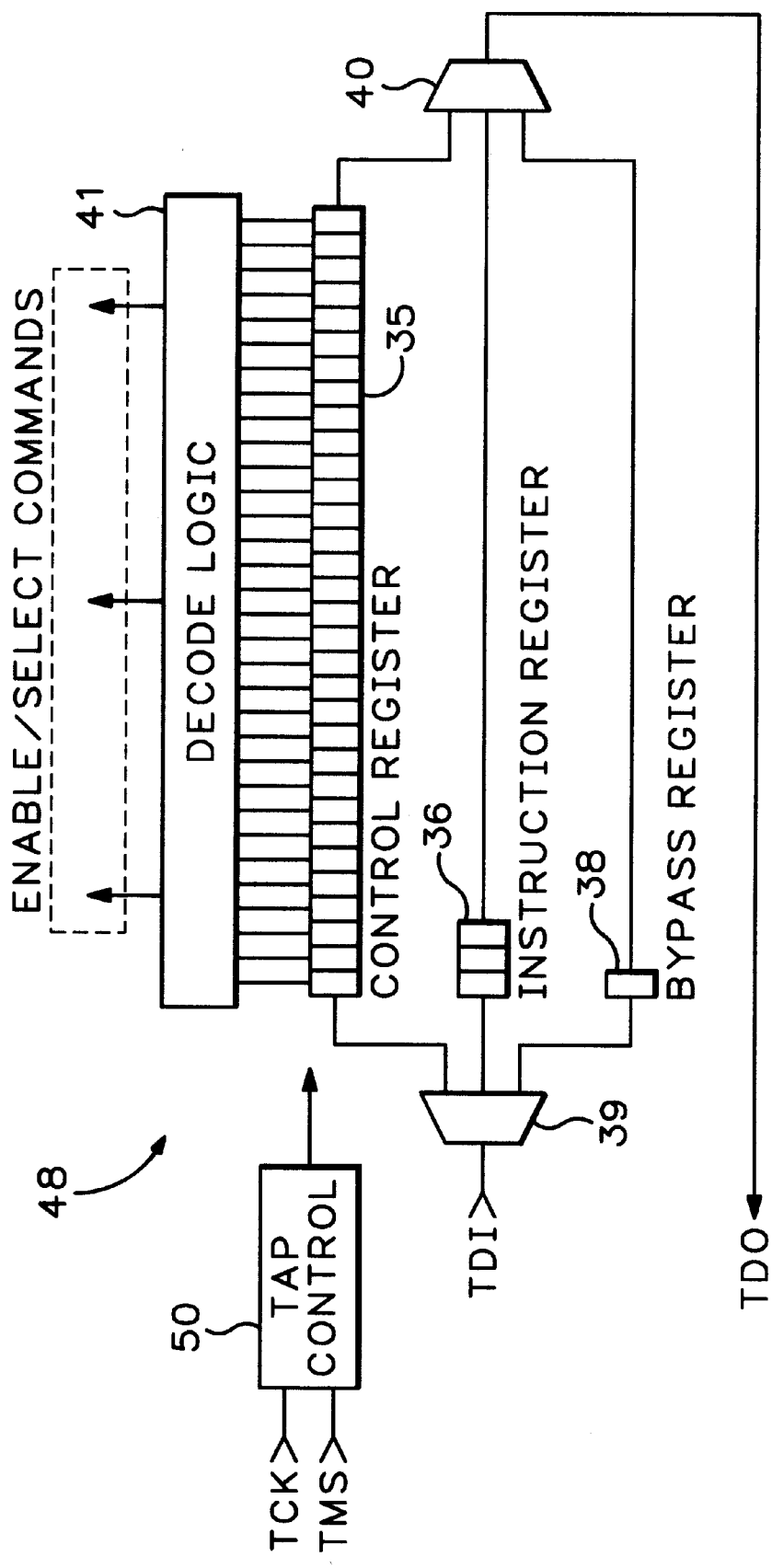
FIG. 3 is a block diagram of the program bus portions of the test circuitry of FIG. 1.

Referring now to FIG. 3, each analog probe circuit Pn and each timing analyzer circuit TAn has associated with it an instance of the circuitry shown at the center and right of FIG. 3. (The TAP Controller 50 is common to all of the timing analyzer circuits TAn and analog probe circuits Pn in a test cell, and test cells will be further explained below.) Test input data TDI is loaded serially into a control register 35, an instruction register 36 and a bypass register 38 through demultiplexer 39. A test data output multiplexer 40 is coupled to have as inputs the outputs from the control register 35, the instruction register 36 and the bypass register 38 to provide test output data TDO back to the boundary scan interface. A decoder logic circuit 41 converts the contents of the control register 35 into respective enable/select signals for timing analyzers TAn, the probes Pn, and the multiplexer 52.

The TAP control/Timing Analyzer Calibration block 50 includes a shared delay calibration circuit that calibrates each delay element in the interpolators for every channel to be a specific submultiple of the external clock obtained from the multi-chip module being tested. The shared delay calibration circuit is a voltage-controlled ring oscillator and multiplexer, with the delay elements in the oscillator being the same as those in the interpolators. A voltage generator converts an error voltage from a phaselocked loop, which compares the oscillator output with the external clock, into a calibrated control voltage for the interpolator and ring oscillator delay elements. The voltage generator provides a maximum possible range of values compatible with the power supply voltages, which in turn provides a wide range of external clock frequencies over which the timing analyzer operates. The timing analyzers TAn and calibration circuit 50 are described in detail in "Timing Analyzer for Embedded Testing," U.S. Pat. No. 5,428,626, hereby incorporated by reference.

The analog probes Pn receive analog signals from test points in the interconnect layers 16 and 18, coupling them via programmable input buffer amplifiers to respective analog routers. The outputs from the analog routers are input to programmable output buffer amplifiers such that up to m of n input points may be connected to any of m output points. The m outputs are input to respective differential input/output amplifiers where they are compared to a reference signal and produce differential outputs. A routing switch has as inputs desired reference voltage levels and an input from an uncommitted input buffer amplifier. One of these inputs to the routing switch is selected as the reference signal. A programmable 50 ohm termination is provided for the differential outputs if desired. The analog probes Pn are the subject of a patent entitled "Analog Multi-Channel Probe System," U.S. Pat. No. 5,418,470, hereby incorporated by reference.

Figure 4:
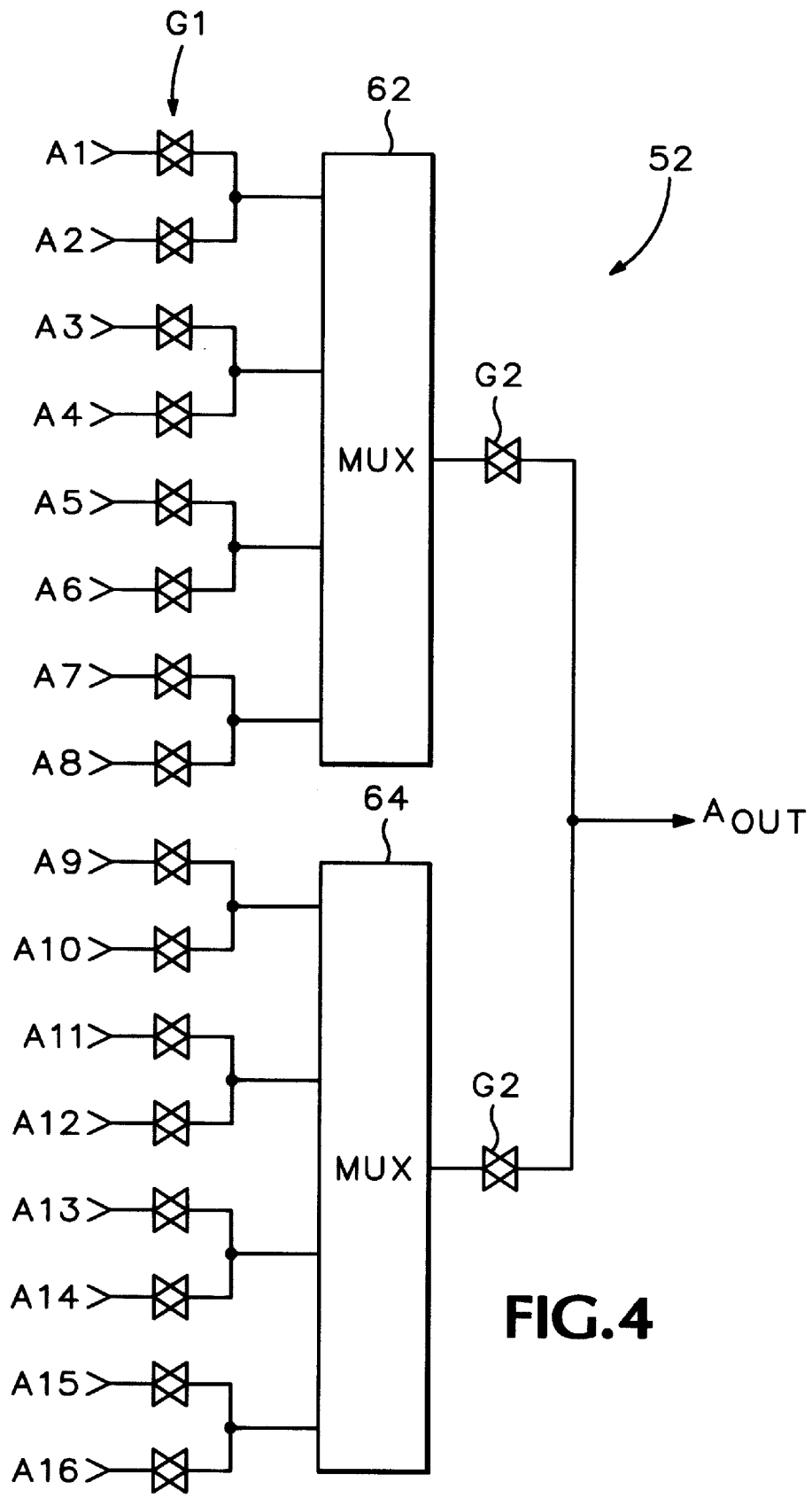
FIG. 4 is a block diagram of the multiplexer portion of the test circuitry of FIG. 2.

An exemplary embodiment of multiplexers 52 of FIG. 2 is shown in FIG. 4. In this embodiment, there are 16 outputs A1–A16 from 16 analog probes Pn, 8 of which are redundant. The outputs An are connected to first respective transmission gates G1, whose outputs of adjacent pairs are interconnected and provided as inputs to a pair of 4:1 multiplexers 62 and 64. The outputs of multiplexers 62 and 64 are provided to second respective transmission gates G2 whose outputs are connected. The analog output $A_{out}$ of the second transmission gates G2 is the analog output $A_{out}$ of the multiplexer 52. The transmission gates G1 and G2 and the multiplexers 62 and 64 are controlled by the TAP Control block 50, enabling routing of a selected output An to the multiplexer analog output $A_{out}$.

It will be recognized that alternative arrangements of the multiplexer 52 are possible, the arrangement of FIG. 4 being only one of the many possibilities. The exact arrangement will depend on the number of outputs An from the analog probes Pn, the desired redundancy, and the number of desired analog outputs $A_{out}$.

The first transmission gates GI select which of the redundant probe outputs An to use for each I/O channel Cn. These selections are determined when evaluating the MCM development substrate 12 and then remain constant. The multiplexers 62 and the second transmission gates G2 select which of the channels Cn to provide to the analog output $A_{out}$. These selections can vary with each test. Thus it is preferred to keep the transmission gates GI that select which of the redundant probe outputs An separate from the multiplexers 62 and transmission gates G2 that select the channel to provide to the analog output $A_{out}$.

Figure 5:
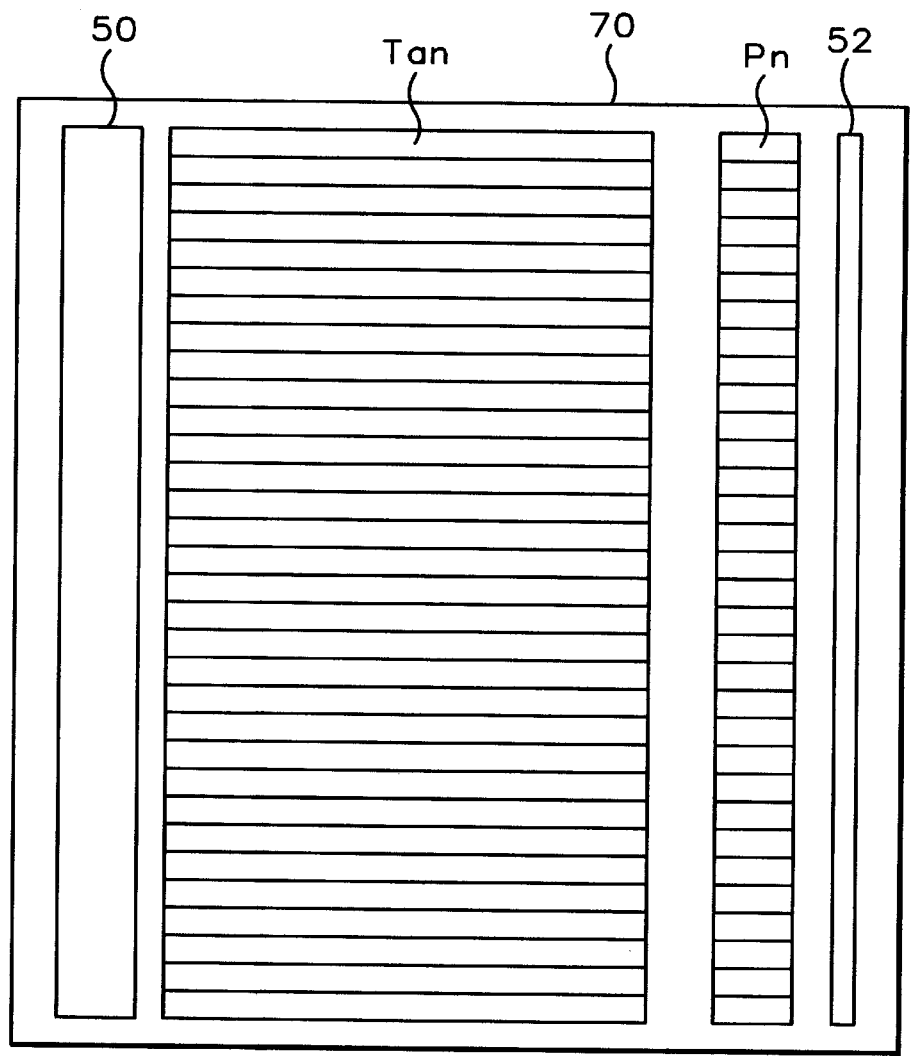
FIG. 5 is a plan view of a test cell containing the test circuitry of FIG. 1.
Figure 6:
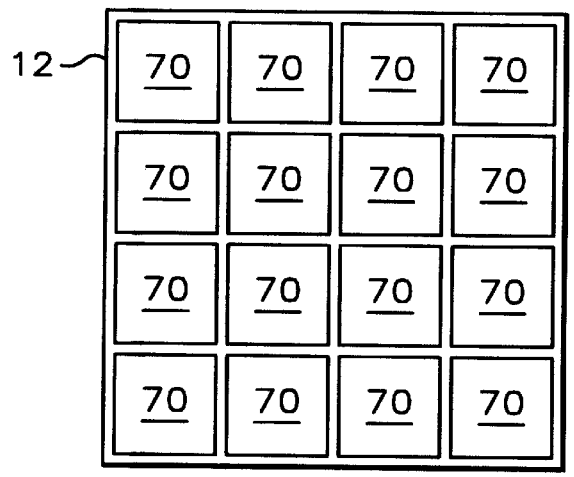
FIG. 6 is a plan view of a MCM development substrate having an array of test cells such as the test cell of FIG. 5.

Referring now to FIG. 5, test circuit 10 can be laid out in a substantially square test cell 70. As shown in FIG. 6, these test cells 70 can then be arrayed in a pattern to cover the entire substrate 12. The components of test circuit 10 are arranged with the TAP Control/Timing Analyzer circuitry 50 on the left of the test cell 70. The timing analyzers TAn are arranged adjacent one another in a column, as are the analog probes Pn. The analog multiplexers and drivers 52 are on the right side of test cell 70.

As shown in FIG. 5, the I/O channels Cn would be arranged in a single column between the column of timing analyzers TAn and the column of analog probes Pn. In an exemplary embodiment, the conductors that the I/O channels Cn connect to are spaced on 30 mil centers. Thus, horizontal lead lines would need to be moved at most 15 mils to intersect a conductor for an I/O channel Cn. Alternatively, a stub could connect a lead line with the conductor associated with an I/O channel.

If the traces on the interconnect layers 16 and 18 are primarily in a direction parallel to the row or column of I/O channel conductors, both of the interconnect layers 16 and 18 will be needed to route traces to the I/O channel conductors without crossing other traces. Alternatively, a test circuit test cell 70 could be rotated 90 degrees such that the interconnect traces travel predominantly in a direction perpendicular to the row of I/O channel conductors, thereby making an interconnect structure 17 having only a single interconnect layer possible. One advantage of having square test circuit test cells 70 is that individual test cells can be rotated independently without displacing adjacent test cells 70.

Figure 7:
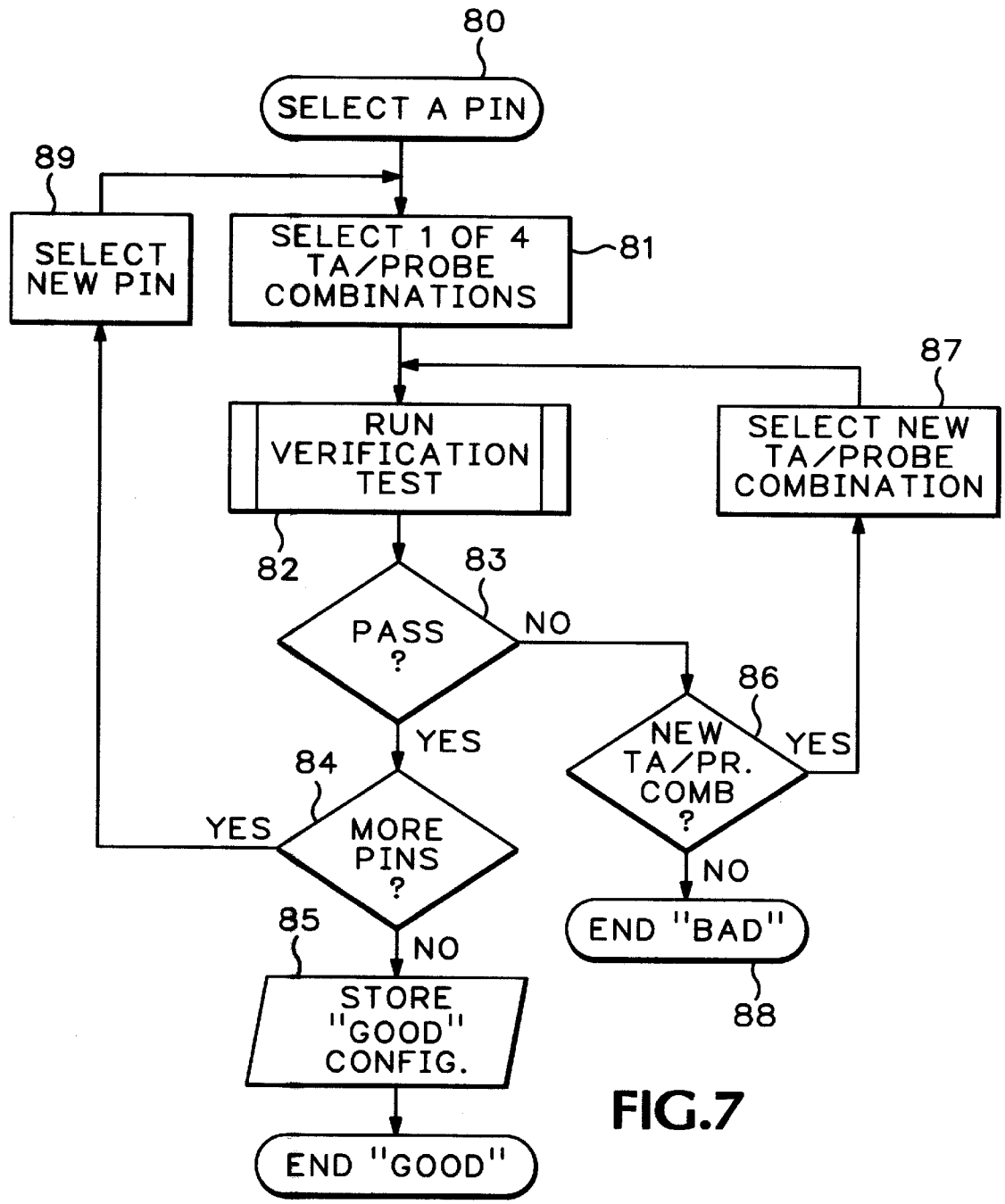
FIG. 7 is a flow chart of a routine to determine which of the redundant circuit components to use.

Referring now to FIG. 7, the redundant timing analyzers TAn and analog probes Pn connected to the I/O channels Cn or "pins" must be tested prior to use to determine which combination of timing analyzers TAn and probes Pn results in faultless operation. As a first step, shown in block 80, a first pin is selected and one of its four combinations of timing analyzers TAn and probes Pn is also selected at block 81. This combination is tested at block 82 for proper functioning. If proper the timing analyzer/probe combination passes at step 84, the process continues by selecting a new pin 89.

If a timing analyzer/probe combination fails at block 83, and there are other combinations of redundant components available, as determined at block 86, then a different combination is selected at block 87, and the process continues. If a timing analyzer/probe combination fails at block 83, and there are no other combinations at block 86, then the substrate fails, at block 88. Once all of the channels Cn have been tested and verified, then the configuration of each channel Cn is stored at block 85.

Once the operation of all of the test circuitry has tested and verified, and the proper configurations for each channel have been established, the test circuitry may then be used to test the circuitry implemented by the various integrated circuits of the multi-chip module. By using the connections available through the vias 38 and the ability of the boundary scan programming bus and multiplexers 52 to switch different timing analyzer circuits and analog probe circuits in and out of operation, various tests may be performed at a variety of points within the circuitry on the MCM. Once its proper design and operation has been verified by testing a prototype, a multi-chip module production substrate (i.e., without any test circuitry included) can be used to make mass produced copies of the MCM without the extra costs associated with the development version of the substrate.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

I claim:

1. An integrated circuit multi-chip module test and development substrate, comprising:
   a first inactive semiconductor substrate layer (34);
   a test circuit layer (30) disposed above the first inactive substrate layer, the test circuit layer comprising signal measurement circuitry and a channel (C1) adapted to communicate electrical signals;
   a second inactive semiconductor substrate layer (32) disposed above the test circuit layer;
   an interconnect structure (17) disposed above the second inactive semiconductor substrate layer, the interconnect structure including a conductive run and being adapted to receive one or more integrated circuit chips, said integrated circuit chips being mounted thereon; and
   an electrically conductive via (38) extending through the second inactive semiconductor substrate layer to connect the channel in the test circuit layer with the conductive run In the interconnect structure;
   wherein said test circuit layer communicates said electrical signals for testing said integrated circuit chips after said integrated circuit chips are mounted on said test and development substrate.

2. The multi-chip module development substrate according to claim 1 wherein the interconnect structure comprises a single interconnect layer (16).

3. The multi-chip module development substrate according to claim 1 wherein the interconnect structure comprises a plurality of interconnect layers (16,18).

4. The multi-chip module development substrate according to claim 1 wherein the signal measurement circuitry comprises a timing analyzer circuit (TA1).

5. The multi-chip module development substrate according to claim 1 wherein the signal measurement circuitry comprises an analog probe circuit (P1).

6. The multi-chip module development substrate according to claim 1 wherein the signal measurement circuitry comprises a plurality of timing analyzer circuits (TA1) and a plurality of analog probe circuits (P1) and a plurality of channels (Cn) adapted to communicate electrical signals.

7. The multi-chip module development substrate according to claim 6 further comprising an IEEE 1149.1-type boundary scan interface (48) for programming the signal measurement circuitry in the test circuit layer.

8. The multi-chip module development substrate according to claim 6 wherein the signal measurement circuitry comprises a plurality of test cells each comprising a timing analyzer circuits (TAn) an analog probe circuit (Pn) and a channel (Cn) adapted to communicate electrical signals.

9. The multi-chip module development substrate according to claim 8 wherein each of the plurality of test cells is contained within a substantially square area (70).

10. The multi-chip module development substrate according to claim 9 wherein one of the test cells is rotated approximately 90 degrees with respect to another of the test cells.

11. The multi-chip module development substrate according to claim 8 wherein each of the test cells comprise at least two timing analyzer circuits and at least two analog probe circuits and means to select (G1) which timing analyzer circuit and which analog probe circuits are to be used at a particular time.

12. The multi-chip module development substrate according to claim 1 further comprising an IEEE 1149.1-type boundary scan interface (48) for programming the signal measurement circuitry in the test circuit layer.

13. A method for developing an integrated circuit multi-chip module test and development substrate, comprising:
   embedding a test circuit layer (30) between a first inactive semiconductor substrate layer (34) and a second semiconductor substrate layer (32), the test circuit layer including signal measurement circuitry and a channel (C1) adapted to communicate electrical signals;
   disposing an interconnect structure (17) above a second inactive semiconductor substrate layer (26), the interconnect structure including a conductive run and being adapted to receive one or more integrated circuit chips, said integrated circuit chips being mounted thereon; and
   providing an electrically conductive via (38) extending through the second inactive semiconductor substrate layer to connect the channel of the test circuit layer with the conductive run of the interconnect structure;
   said test circuit layer being used for testing said integrated circuit chips after said integrated circuit chips are mounted on said multichip module test and development substrate.

14. The method according to claim 13 wherein the interconnect structure comprises a single interconnect layer (16).

15. The method according to claim 13 wherein the interconnect structure comprises a plurality of interconnect layers (16,18).

16. The method according to claim 13 wherein the embedding step comprises the step of providing within the signal measurement circuitry redundant test circuits that are selectable to bypass inoperative test circuits.

17. The method according to claim 16 further comprising the step of: testing the test circuits to identify inoperative test circuits; and bypassing inoperative test circuits using redundant test circuits.

* * * * *